United States Patent [19]

Wakabayashi

[11] Patent Number: 5,705,856
[45] Date of Patent: Jan. 6, 1998

[54] SEMICONDUCTOR DEVICE

[75] Inventor: Takeshi Wakabayashi, Sayama, Japan

[73] Assignee: Casio Computer Co., Ltd., Tokyo, Japan

[21] Appl. No.: 623,990

[22] Filed: Mar. 29, 1996

Related U.S. Application Data

[62] Division of Ser. No. 332,697, Nov. 1, 1994, Pat. No. 5,538,920.

[30] Foreign Application Priority Data

Nov. 5, 1993 [JP] Japan ................... 5-299057

[51] Int. Cl.$^6$ .............................. H01L 23/48; H01L 23/52
[52] U.S. Cl. ................... 257/759; 257/735; 257/758; 257/774; 438/623; 438/673
[58] Field of Search ................... 257/735, 750, 257/758, 759, 773, 774; 438/622, 623, 652, 673

[56] References Cited

U.S. PATENT DOCUMENTS

| | | | |
|---|---|---|---|
| 3,700,497 | 10/1972 | Epifano et al. | 437/183 |
| 5,057,453 | 10/1991 | Endo et al. | 437/183 |
| 5,108,950 | 4/1992 | Wakabayashi et al. | 437/183 |
| 5,244,833 | 9/1993 | Gansauge et al. | 437/183 |
| 5,538,920 | 7/1996 | Wakabayashi | 437/183 |

FOREIGN PATENT DOCUMENTS

| | | |
|---|---|---|
| 0316912 | 5/1989 | European Pat. Off. . |
| 0316912 A2 | 5/1989 | European Pat. Off. . |
| 59178745 | 6/1985 | Japan . |

OTHER PUBLICATIONS

Ostmann., 'The Pretreatment of Al Bondpads,' IEEE pp.74–78, Mar. 15, 1993.
Lo,'Backsputtering Etch Studies' Solid State Tech. Jun.1990.
Patent Abstracts of Japan, vol. 9, No. 27 (E–294) Feb. 6, 1985 & JP–A–59 172 745 (Matsushita Denshi Kogyo KK).
Proceedings of the IEEE Multi–Chip Module Conference MCMC–93, Santa Cruz, CA., US, pp. 74–78, Ostmann et al "The pretreatment of aluminium bondpads for electroless nickel plating".
Solid State Technology, vol. 33, No. 6, Jun. 1990, Washington, US, pp.91–94, Lo and Tjhia "Backsputtering etch studies in wafer bumping process".

*Primary Examiner*—Tom Thomas
*Assistant Examiner*—David Ostrowski
*Attorney, Agent, or Firm*—Frishauf, Holtz, Goodman, Langer & Chick, P.C.

[57] ABSTRACT

A semiconductor device has a connection electrode and protective film formed of organic material and covering the connection electrode. An opening is formed in the protective film to expose the connection electrode. A natural oxide layer is etched by argon-based dry etching. The surface layer of the protective film is altered to reduce the insulativity in the dry etching process. After a projection electrode is formed on the connection electrode later, the altered surface layer of the protective film is removed by oxygen-based dry etching. As no altered surface layer remain on the protective film, an adverse affect such as inadequate insulation does not occur.

20 Claims, 3 Drawing Sheets

SEMICONDUCTOR DEVICE

This is a division of application Ser. No. 08/332,697 filed Nov. 1, 1994, now U.S. Pat. No. 5,838,920 issued Jul. 23, 1996.

BACKGROUND OF THE INVENTION

1. Field of the Invention

The present invention relates to a method of fabricating a semiconductor device.

2. Description of the Related Art

There is a semiconductor device (IC chip) mounting scheme called a TAB (Tape Automated Bonding) system by which a semiconductor device is mounted on a TAB tape. In this case, bump electrodes provided on a semiconductor device are connected to finger leads (inner leads) on the TAB tape by gold-tin eutectic bonding, gold-gold thermo-compression bonding or the like.

Semiconductor devices are generally designed in such a form that connection electrodes formed on a silicon wafer (semiconductor device body or die chip) are exposed through an opening formed in a passivation film formed on the silicon wafer. Bump electrodes (projection electrodes) are formed on the connection electrodes. The connection electrodes are made of a base metal such as aluminum or aluminum alloy. In fabricating a semiconductor device with such a structure, an insulative natural oxide layer formed on the surface of each connection electrode is removed with argon ions by dry etching before a bump electrode is formed on the connection electrode.

To better protect the surface of a semiconductor device, the structure, in which a protective film made of polyimide is formed on the passivation film made of silicon nitride or the like, is proposed. In fabricating a semiconductor device with this structure, dry etching with argon ions is carried out to remove the natural oxide layer formed on the surface of the connection electrode, after the protective film made of polyimide is formed. The surface layer of the protective film is altered and deteriorated by the argon ions. This decreases the insulating resistance to result in inadequate insulation, so that electric leakage or short-circuiting may at last occur between the adjoining connection electrodes.

SUMMARY OF THE INVENTION

It is therefore an object of the present invention to provide a method of fabricating a semiconductor device which is not adversely affected by alteration of the surface layer of a protective film made of polyimide if occurred.

To achieve the above object, there is provided a semiconductor device fabricating method, which comprises the steps of providing a connection electrode on one surface of a semiconductor substrate; forming an organic film having an opening formed on one surface of the substrate, at least a part of a surface of the connection electrode being exposed through the opening; etching an exposed surface layer of the connection electrode; depositing a projection electrode on the connection electrode; and etching a surface layer of the organic film.

BRIEF DESCRIPTION OF THE DRAWINGS

FIG. 1(A) shows a structure in which a protective film, a layer for forming an intermediate connection film and a thin layer for forming a thin gold film are formed on a silicon wafer;

FIG. 1(B) shows a situation in which exposure with a photomask is being performed after a photoresist film is formed on the silicon wafer;

FIG. 1(C) shows a structure in which an opening is formed in the photoresist film on the silicon wafer;

FIG. 1(D) shows a structure in which a bump electrode is formed in the opening formed in the photoresist film; and FIG. 1(E) shows a structure after the removal of the photoresist film and unnecessary portions of the layer for forming the intermediate connection film and the thin layer for forming the thin gold film.

DETAILED DESCRIPTION OF THE PREFERRED EMBODIMENTS

The semiconductor device according to one embodiment of the present invention will now be described referring to FIGS. 1(A) to 1(E). FIGS. 1A to 1(E) are cross-sectional views illustrating the steps of fabricating a semiconductor device according to the embodiment.

Figure 1A:
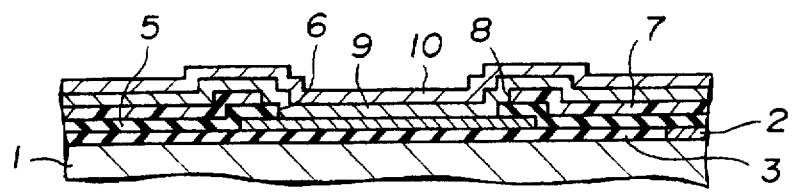
FIG. 1(A) to 1(E) are cross-sectional views illustrating each of the fabrication steps for a semiconductor device according to one embodiment of the present invention.

As shown in FIG. 1(A), an internal electrode 2, such as a gate electrode, and an insulating film made of silicon oxide or the like is formed on a silicon wafer (semiconductor substrate or semiconductor device body) 1. A connection electrode 4, made of a base metal such as aluminum or aluminum alloy, is formed on the insulating film 3. The connection electrode 4 is connected to the internal electrode 2 by an interconnection (not shown). A passivation film 5 of an inorganic material, such as silicon nitride, is formed on the entire surface of the insulating film 3 and the connection electrode 4. Then, an opening 6 is formed at a predetermined location in the passivation film 5 by etching, so that the center portion of the connection electrode 4 is exposed through this opening 6. The passivation film 5 around the connection electrode 4 and on the top of the insulating film 3 is left. A protective film 7 of an organic material, such as a resin like polyimide, is deposited about 1 to 5 µm thick on the entire surface of the passivation film 5 and the connection electrode 4. An opening 8 is formed at a predetermined location in the protective film 7 by etching, so that the center portion of the connection electrode 4 is exposed through the openings 6 and 8. The protective film 7 on the surface of the passivation film 5 excluding its opening 6 is left. In this embodiment, the opening 8 of the protective film 7 has a larger outer shape than the opening 6 of the passivation film 5.

To remove an insulative natural oxide layer (not shown) formed on the surface of the connection electrode 4, dry etching with argon ions is performed on the entire surface of the silicon wafer 1 in vacuum. The surface layer of the protective film 7 made of polyimide is altered due to the argon ions, forming an alteration layer (not shown) with a thickness of about 100 to 200 nm. Next, to prevent the oxidization of the surface layer of the connection electrode 4, the silicon wafer 1 is subjected to the next step in vacuum. In the next step, an alloy, such as titan-tungsten, and gold are vapor-deposited or sputtered on the resultant structure in the named order, yielding a layer (alloy layer) 9 for forming an intermediate connection film and a thin layer (metal layer) 10 for forming a thin gold film with thicknesses of about, for example, 200 to 600 nm.

Figure 1B:
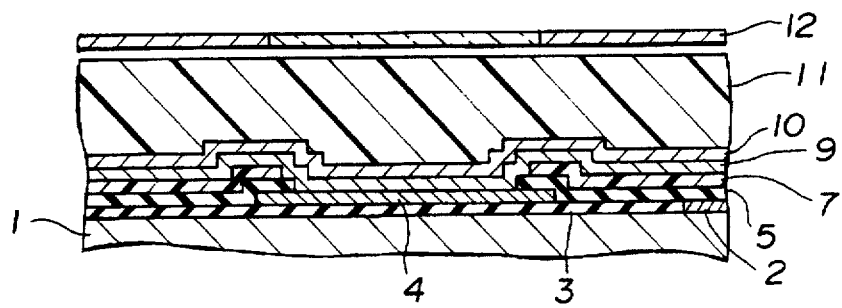

Next, a photoresist drop is put on the surface of the thin film 10 and spin coating is then performed to form a relatively thick photoresist film 11 of about 20 to 30 μm thickness, as shown in FIG. 1(B). To make the photoresist film 11 relatively thick to have a thickness of about 20 to 30 μm, the photoresist drop used in this embodiment (e.g., BMR1000 produced by TOKYO OHKA KOGYO Co., Ltd.) should have a viscosity of 300 to 1700 CPS (centipoises), several 3 to 17 times greater than the viscosity of an ordinary one. The rotational speed for the spin coating should be 200 to 700 rpm.

The photoresist film 11 is exposed using a predetermined photomask 12 as shown in FIG. 1(B).

Figure 1C:
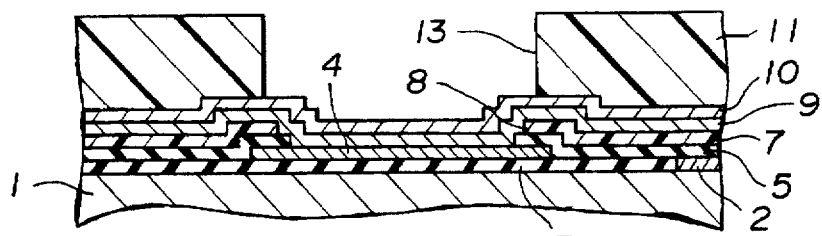

The exposed photoresist film 11 is developed to form an opening 13 at a predetermined location in the photoresist film 11. More specifically, the opening 13 is formed in the portion corresponding to the opening 8 of the protective film 7 and an area around the opening 8, as shown in FIG. 1(C). In this case, an organic solvent essentially consisting of xylene (e.g., C-3 produced by TOKYO OHKA KOGYO Co., Ltd.) is used as a developer.

Figure 1D:
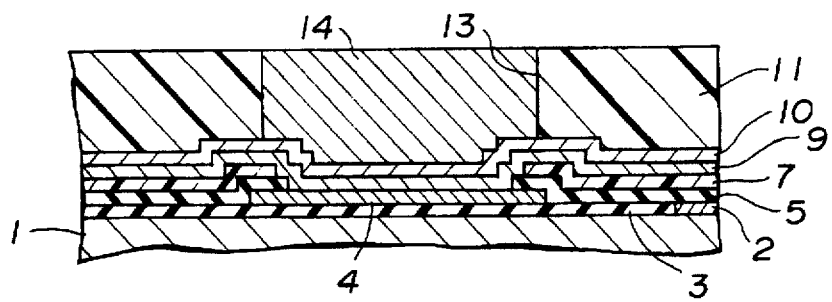

Then, gold is electroplated in the opening 13, forming a straight bump electrode (projection electrode) 14 on the top of the thin layer 10 in the opening 13, as shown in FIG. 1(D). To permit the bump electrode 14 to have a flatten top and a straight shape, the bump electrode 14 has a thickness of about 20 to 30 μm with its top surface not protruding from the top surface of the photoresist 11. After the formation of the bump electrode 14, the photoresist film 11 is removed using an organic solvent essentially consisting of ethyl cellosolve and dichlorobenzene (e.g., a release agent SP produced by TOKYO OHKA KOGYO Co., Ltd.).

Figure 1E:
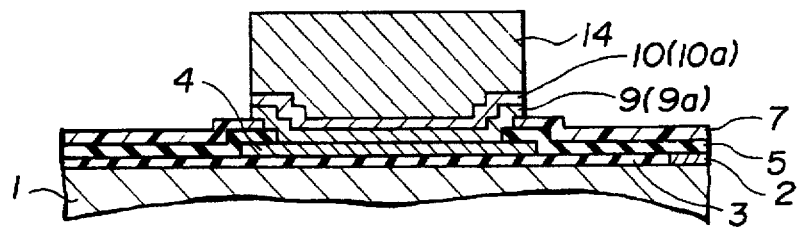

Next, with the bump electrode 14 used as an etching mask, the unnecessary portion of the thin layer 10 is etched out with an iodic etching solution so that a thin gold film 10a is formed by the remaining thin layer 10, as shown in FIG. 1(E). Next, with the bump electrode 14 used again as an etching mask, the unnecessary portion of the layer 9 is removed by dry etching, so that an intermediate connection film 9a is formed by the remaining layer 9. Then, dry etching is performed on the entire surface of the silicon wafer 1 by oxygen plasma to remove the alteration layer i.e., the surface layer of the protective film 7. A microwave ashing system may be used for this purpose. When a microwave ashing system MAS800 manufactured by CANON Inc. was used under the conditions of a frequency of 2450 MHz, output power of 500 W, a plate temperature of 150° C., an oxygen flow rate of 150 SCCM, pressure of 0.8 mmTorr and a processing time of 20 to 40 seconds, the surface layer of the protective film 14 made of polyimide was removed by an amount of about 200 to 500 nm.

The surface of the bump electrode 14 of gold is not etched nor altered by the oxygen plasma. An RF (Radio Frequency) ashing system or the like may be used, or an ozone treatment or the like may be performed.

According to the thus obtained semiconductor device, the surface layer of the protective film 7 is removed by dry etching after the bump electrode 14, the thin gold film 10a and the intermediate connection film 9a are formed. Therefore, even if the surface layer of the protective film 7 is altered by the dry etching to remove the insulative, natural oxide layer formed on the surface of the connection electrode 4, the adverse affect by the alteration of the surface layer of the protective film 7 can be prevented.

Figure 2A:
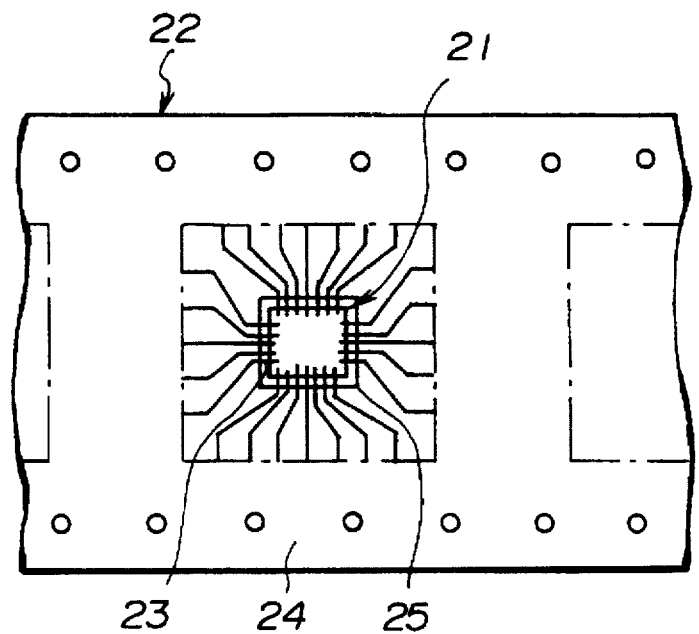
FIG. 2(A) is a plan view of a structure in which the bump electrodes of the semiconductor device are connected to finger leads of a TAB tape.
Figure 2B:
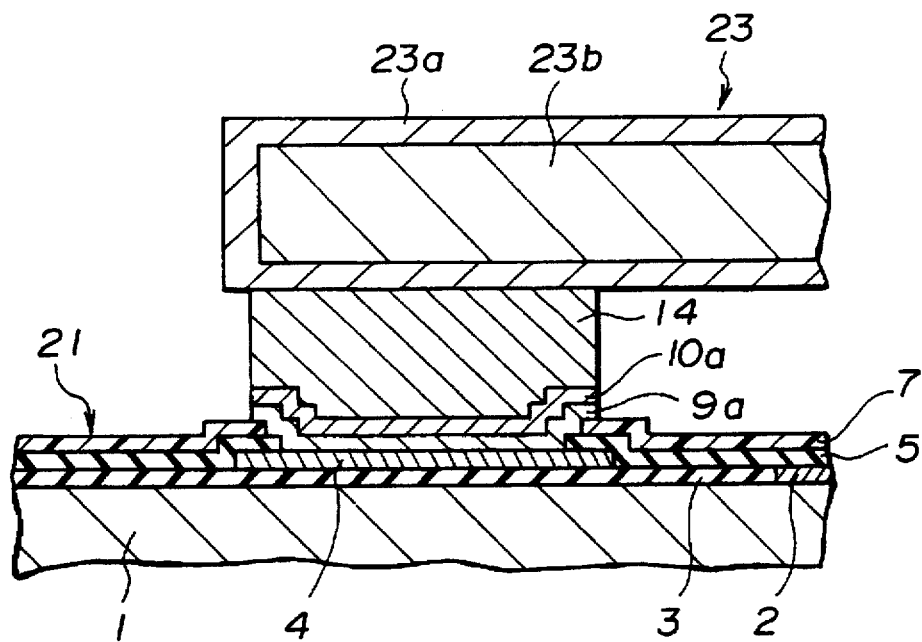
FIG. 2(B) is a cross-sectional view of a part of the structure shown in FIG.2(A)

With reference to FIGS. 2(A) and 2(B), a description will now be given of the case where the bump electrodes of a semiconductor device fabricated in the above manner are bonded to the finger leads of a TAB tape. First, the silicon wafer 1 having undergone the above-described steps is diced into a plurality of semiconductor devices (chips) 21. A single semiconductor device 21 has a plurality of bump electrodes 14 mentioned above. A TAB tape 22 has a plurality of finger leads 23. The finger leads are formed by: patterning a copper foil 23b laminated on a base tape 24, into a predetermined shape; and then plating solder 23a on the surface of the portions of the patterns where the bump electrodes 14 of the semiconductor device 21 are to be connected. The finger leads 23 protrude into a device hole 25 formed in the base tape 24. The semiconductor device 21 is placed in the device hole 25, and the individual bump electrodes 14 are bonded to the associated finger leads 23 by soldering with the solder 23a. After the bump electrodes 14 of the semiconductor device 21 are connected to the finger leads 23 of the TAB tape 22, a protecting resin (not shown) is potted on the semiconductor device 21 to cover and protect the semiconductor device 21, and then the portion indicated by the dashed line in FIG. 2(A) is cut out.

Figure 3:
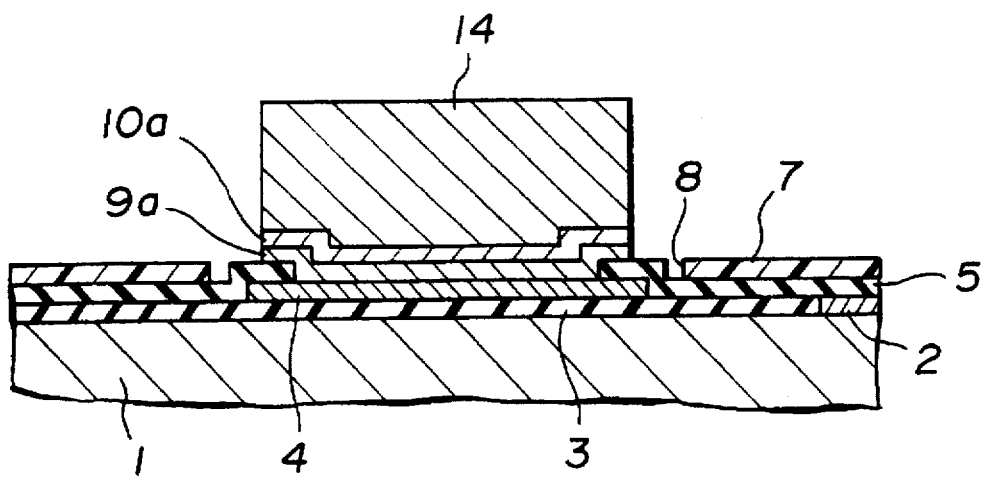
FIGS. 3(A) and 3(B) are cross-sectional views respectively showing modifications of the semiconductor device embodying this invention.
Figure 3:
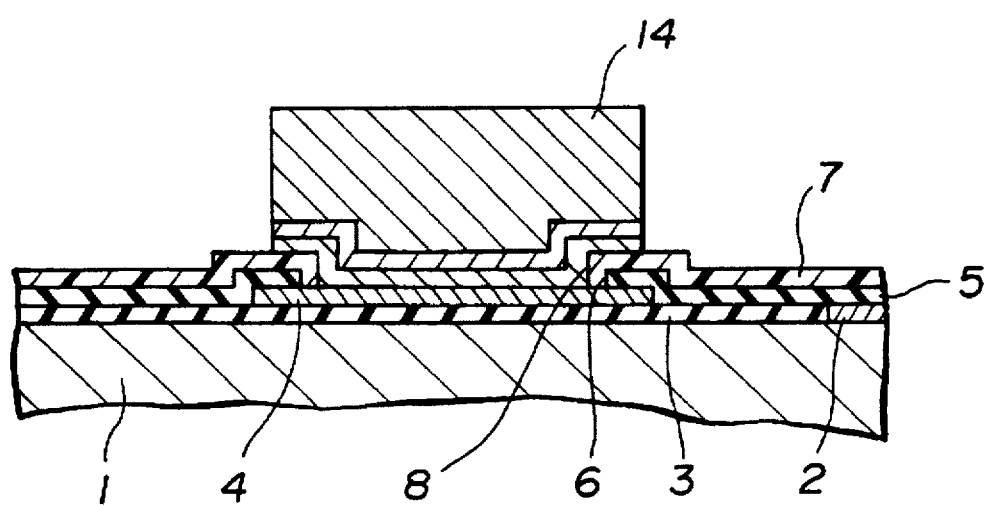

FIGS. 3(A) and 3(B) show modifications of the semiconductor device embodying the present invention. In the semiconductor device shown in FIG. 3(A), as compared with the one shown in FIG. 1(E), the opening 8 of the protective film 8 has a larger outer shape than the connection electrode 4. In the semiconductor device shown in FIG. 3(B), as compared with the one shown in FIG. 1(E), the opening 8 of the protective film 8 has a smaller outer shape than the opening 6 of the passivation film 5.

Although the bump electrode 14 is made of gold in the above-described examples, the bump electrode 14 may be made of solder.

What is claimed is:

1. A semiconductor device, comprising:
    a semiconductor substrate;
    a connection electrode formed on a surface of said semiconductor substrate;
    an organic film formed on said semiconductor substrate, said organic film covering a periphery of said connection electrode and having an opening such that a middle part of a surface of said connection electrode is exposed through said opening; and
    a projection electrode formed on said connection electrode,
    wherein a predetermined portion of said organic film which covers said periphery of said connection electrode is located between said connection electrode and said projection electrode and an outer portion of said organic film around said predetermined portion of said organic film is one of (i) thinner than said predetermined portion and (ii) totally etched.

2. The semiconductor device according to claim 1, further comprising an inorganic film formed on said surface of said semiconductor substrate, said inorganic film having an opening such that at least a part of said surface of said connection electrode is exposed through said opening of said inorganic film and,
    wherein a part of said inorganic film is located between said connection electrode and said projection electrode.

3. The semiconductor device according to claim 2, wherein said opening of said organic film has a larger outer shape than said opening of said inorganic film.

4. The semiconductor device according to claim 3, wherein said organic film is made of a resin.

5. The semiconductor device according to claim 4, wherein said resin includes polyimide.

6. The semiconductor device according to claim 3, wherein said connection electrode is made of a base metal.

7. The semiconductor device according to claim 3, further comprising an intermediate connection film disposed between said connection electrode and said projection electrode, said intermediate connection film connecting said projection electrode to said connection electrode.

8. The semiconductor device according to claim 2, wherein said opening of said organic film has a smaller outer shape than said opening of said inorganic film.

9. The semiconductor device according to claim 8, wherein said organic film is made of a resin.

10. The semiconductor device according to claim 9, wherein said resin includes polyimide.

11. The semiconductor device according to claim 8, wherein said connection electrode is made of a base metal.

12. The semiconductor device according to claim 8, further comprising an intermediate connection film disposed between said connection electrode and said projection electrode, said intermediate connection film connecting said projection electrode to said connection electrode.

13. The semiconductor device according to claim 12, wherein said organic film is made of a resin.

14. The semiconductor device according to claim 13, wherein said resin includes polyimide.

15. The semiconductor device according to claim 12, wherein said connection electrode is made of a base metal.

16. The semiconductor device according to claim 2, further comprising an intermediate connection film disposed between said connection electrode and said projection electrode, said intermediate connection film connecting said projection electrode to said connection electrode.

17. The semiconductor device according to claim 16, wherein said organic film is made of a resin.

18. The semiconductor device according to claim 17, wherein said resin includes polyimide.

19. The semiconductor device according to claim 16, wherein said connection electrode is made of a base metal.

20. The semiconductor device according to claim 1, further comprising an intermediate connection film disposed between said connection electrode and said projection electrode, said intermediate connection film connecting said projection electrode to said connection electrode.

* * * * *